US006159284A

United States Patent [19]

Ölkrug et al.

[11] Patent Number: 6,159,284

[45] Date of Patent: Dec. 12, 2000

[54] PROCESS AND DEVICE FOR PRODUCING A CYLINDRICAL SINGLE CRYSTAL AND PROCESS FOR CUTTING SEMICONDUCTOR WAFERS

[75] Inventors: Hans Ölkrug, Tittmoning; Holger Lundt, Burghausen; Christian Andrae, Tüssling; Josef Frumm, Fridolfing, all of Germany

[73] Assignee: Wacker Siltronic Gesellschaft für Halbleitermaterialien AG, Burghausen, Germany

[21] Appl. No.: 09/318,657

[22] Filed: May 25, 1999

[30] Foreign Application Priority Data

Jun. 4, 1998 [DE] Germany ........................... 198 25 051

[51] Int. Cl.[7] ........................................ C30B 15/36

[52] U.S. Cl. ............................ 117/28; 117/201; 117/202; 117/902; 117/923

[58] Field of Search ................................ 117/14, 15, 28, 117/201, 202, 902, 923

[56] References Cited

U.S. PATENT DOCUMENTS 4,710,259 12/1987 Howe et al. .
5,229,082 7/1993 Seidensticker et al. .
5,720,271 2/1998 Hauser .

FOREIGN PATENT DOCUMENTS 0359591 3/1990 European Pat. Off. .
0743140 11/1996 European Pat. Off. .

OTHER PUBLICATIONS

English Abstract corresponding to DE 28 27 050 (AN 1980–03657C [03].

G. Janus: FOR 13(1979) No. 3, p. 234–242 English Abstract corresponding to.

*Primary Examiner*—Felisa Hiteshew
*Attorney, Agent, or Firm*—Collard & Roe, P.C.

[57] ABSTRACT

A process and a device will produce a cylindrical single crystal of semiconductor material with the smallest possible alignment error of the crystal lattice. A process for cutting semiconductor wafers from two or more such single crystals is by means of wire sawing. The process for producing the single crystal is as follows: (a) a single crystal with an alignment error of the crystal lattice equal to at most 1.5° is produced; (b) the single crystal is arranged in such a way that the single crystal can be rotated about two axes of rotation, the axes of rotation being perpendicular to two planes that are spanned by two axes of an orthogonal coordinate system with axes x, y and z; (c) the single crystal is rotated about the axes of rotation until the crystal axis is parallel to the x,y plane and parallel to the x,z plane of the coordinate system; (d) pads are fitted to the ends of the single crystal; and (e) the single crystal is rotated about the crystal axis, the single crystal being clamped between the pads in a grinding machine, and a lateral surface of the single crystal is ground until the single crystal has a specific uniform diameter.

10 Claims, 3 Drawing Sheets

PROCESS AND DEVICE FOR PRODUCING A CYLINDRICAL SINGLE CRYSTAL AND PROCESS FOR CUTTING SEMICONDUCTOR WAFERS

BACKGROUND OF THE INVENTION

1. Field of the Invention

The present invention relates to a process and to a device for producing a cylindrical single crystal of semiconductor material with the smallest possible alignment error of the crystal lattice. The invention also relates to a process for cutting semiconductor wafers from two or more such single crystals by means of wire sawing.

2. The Prior Art

The crystal lattice of cylindrical single crystals of semiconductor material often has a particular alignment error. There is an alignment error if the crystal axis and the geometrical axis of the single crystal are at a certain angle. The crystal axis is an axis defining the crystallographic orientation of the crystal lattice. For the production of electronic components, it is in particular necessary to obtain silicon crystals which have, for example, a <100>, <511>, <110> or <111> crystal orientation. The spatial position of the crystal axis is determined using an X-ray optical method, for example according to the process described in German Standard DIN 50433 (part 1). The geometrical axis of a cylindrical single crystal corresponds to the long axis of the single crystal passing through the middle of the single crystal.

Usually, each single crystal needs to be examined to ascertain whether the crystal lattice has an alignment error. Section planes through the single crystal when cutting semiconductor wafers are set so as to provide semiconductor wafers having a desired crystal orientation. This process is especially elaborate and likely to cause error.

SUMMARY OF THE INVENTION

It is an object of the present invention to provide a process which makes it possible to obtain cylindrical single crystals with a precisely oriented crystal axis.

The above object is achieved according to the present invention by providing a process for producing a cylindrical single crystal of semiconductor material, which has a crystal lattice, a crystal axis and a geometrical axis, the spatial position of the crystal axis being established by X-ray optics. The process is one which has the following steps:

(a) producing a single crystal with an alignment error of the crystal lattice equal to at most 1.5°;

(b) arranging the single crystal in such a way that the single crystal can be rotated about two axes of rotation, the axes of rotation being perpendicular to two planes that are spanned by two axes of an orthogonal coordinate system with axes x, y and z;

(c) rotating the single crystal about the axes of rotation until the crystal axis is parallel to the x,y plane and parallel to the x,z plane of the coordinate system;

(d) fitting pads to the ends of the single crystal; and (e) rotating the single crystal about the crystal axis, clamping the single crystal between the pads in a grinding machine, and grinding a lateral surface of the single crystal until the single crystal has a specific uniform diameter.

The present invention also relates to a device which is suitable for carrying out the process of the invention; and this device comprises (a) an X-ray goniometer for establishing a spatial position of a crystal axis of the single crystal;

(b) a rotating device having means on which the single crystal is mounted and having means for rotating the single crystal about two axes of rotation, the axes of rotation being perpendicular to two planes that are spanned by two axes of an orthogonal coordinate system with axes x, y and z; and (c) means for fitting pads to ends of the single crystal.

In order to carry out the process, a single crystal should be provided which is produced using the Czochralski method (CZ) or by the float zone method (FZ). In order to produce the single crystal, it is necessary to have a seed crystal which is preferably detached from monocrystalline material. When obtaining the seed crystal, care should be taken that the crystal lattice of the seed crystal has an alignment error of at most 1.5°. The single crystal growing on the seed crystal should likewise have an alignment error of at most 1.5° and preferably 0.5°. Thus the angle between the geometrical axis of the single crystal and the crystal axis of the single crystal should not exceed the maximum indicated value of 1.5°.

A single crystal produced according to step a) of the process is, according to the invention, arranged in such a way that it can rotate about two axes of rotation which are perpendicular to two planes. These two planes are spanned by two axes of an orthogonal coordinate system with axes x, y and z. In this position, the single crystal is rotated about the axes of rotation until the crystal axis is parallel to the x,y plane and parallel to the x,z plane of the coordinate system. The axes of rotation intersect preferably at the middle L/2 of the single crystal, L being the length of the single crystal. If the point of intersection lies exactly at the middle L/2 and the length L and the final diameter of the ground single crystal are given, then with this position of the point of intersection of the axes of rotation, it is possible to eliminate alignment errors of the crystal axis. If these alignment errors occur and with any other position at the point of intersection of the axes of rotation, it would not be possible to correct without having to go below the given final diameter when grinding the lateral surface.

BRIEF DESCRIPTION OF THE DRAWINGS

Other objects and features of the present invention will become apparent from the following detailed description considered in connection with the accompanying drawing which discloses several embodiments of the present invention. It should be understood, however, that the drawing is designed for the purpose of illustration only and not as a definition of the limits of the invention.

In the drawing, wherein similar reference characters denote similar elements throughout the several views.

DETAILED DESCRIPTION OF PREFERRED EMBODIMENTS

Figure 1:
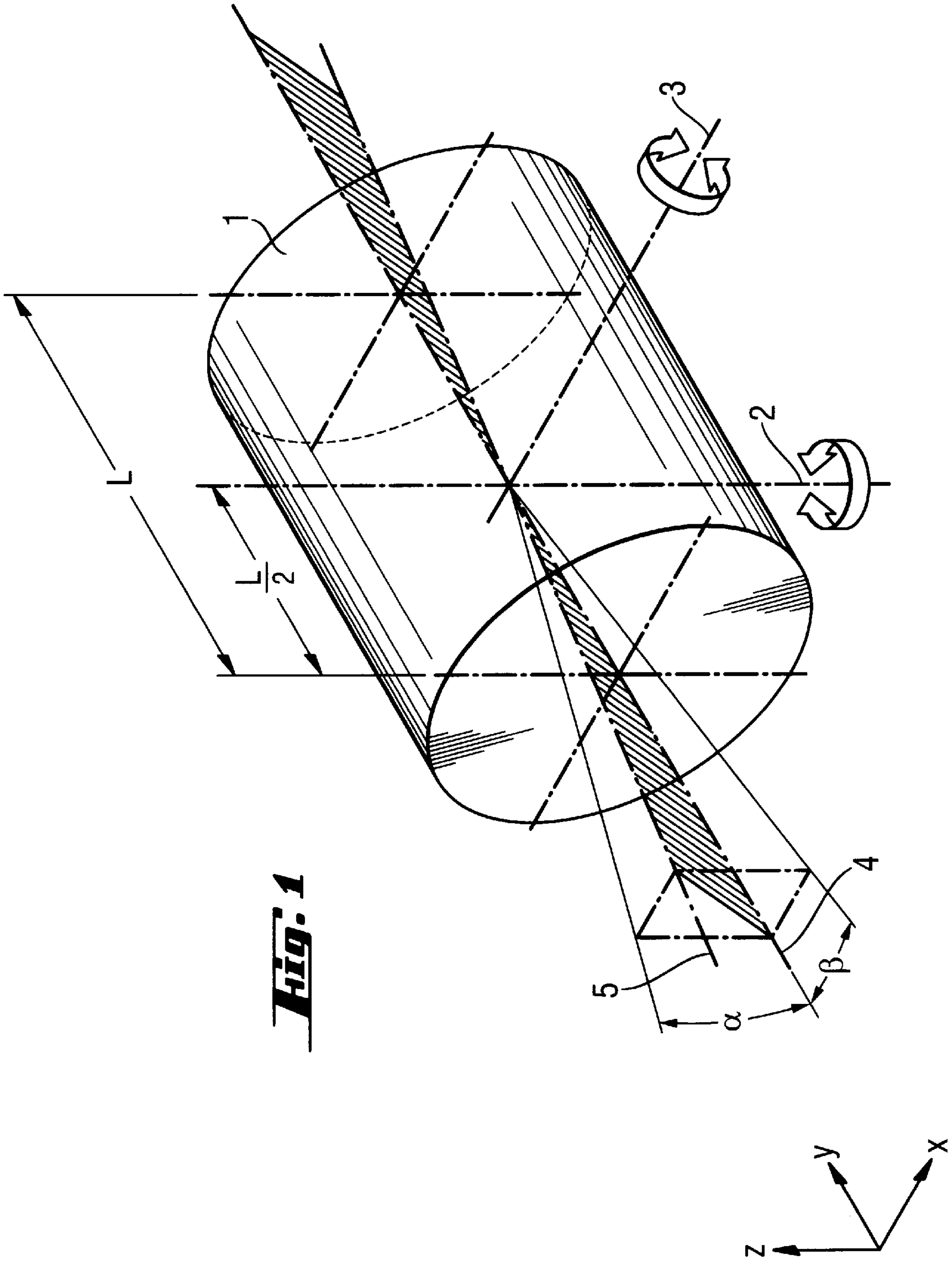
FIG. 1 schematically shows how a single crystal according to one process embodiment of the invention must be moved in space in order to obtain the lowest possible alignment error for the crystal lattice.

Turning now in detail to the drawings, FIG. 1 shows the process embodiment in which the single crystal 1 is rotated about the axes of rotation 2 and 3, which intersect at an angle of 90° and which intersect at L/2. L is the longitudinal length of the crystal 1. The axis of rotation 2 is perpendicular to the x,y plane of the coordinate system, and the axis of rotation 3 is perpendicular to the x,z plane. The axis 4 is the longitudinal or geometrical axis of the single crystal. The axis of rotation 2 is rotated through an angle corresponding to the angle α. The axis of rotation 3 is rotated through an angle corresponding to the angle β. The position of the crystal axis 5 in the coordinate system is established by X-ray optics. To that end, the beam of an X-ray goniometer strikes one end of the single crystal. The rotation of the single crystal may take place with automatic control or may be carried out by an operator. The control variable used is the intensity of the X-radiation scattered on the crystal lattice. The X-ray goniometer is preferably aligned in such a way that the intensity of the X-radiation recorded while rotating the single crystal reaches a maximum. This maximum occurs, respectively, when the crystal axis is aligned parallel to the x,y plane and parallel to the x,z plane. The operator will then have no trouble in rotating the single crystal into the desired position.

Figure 2:
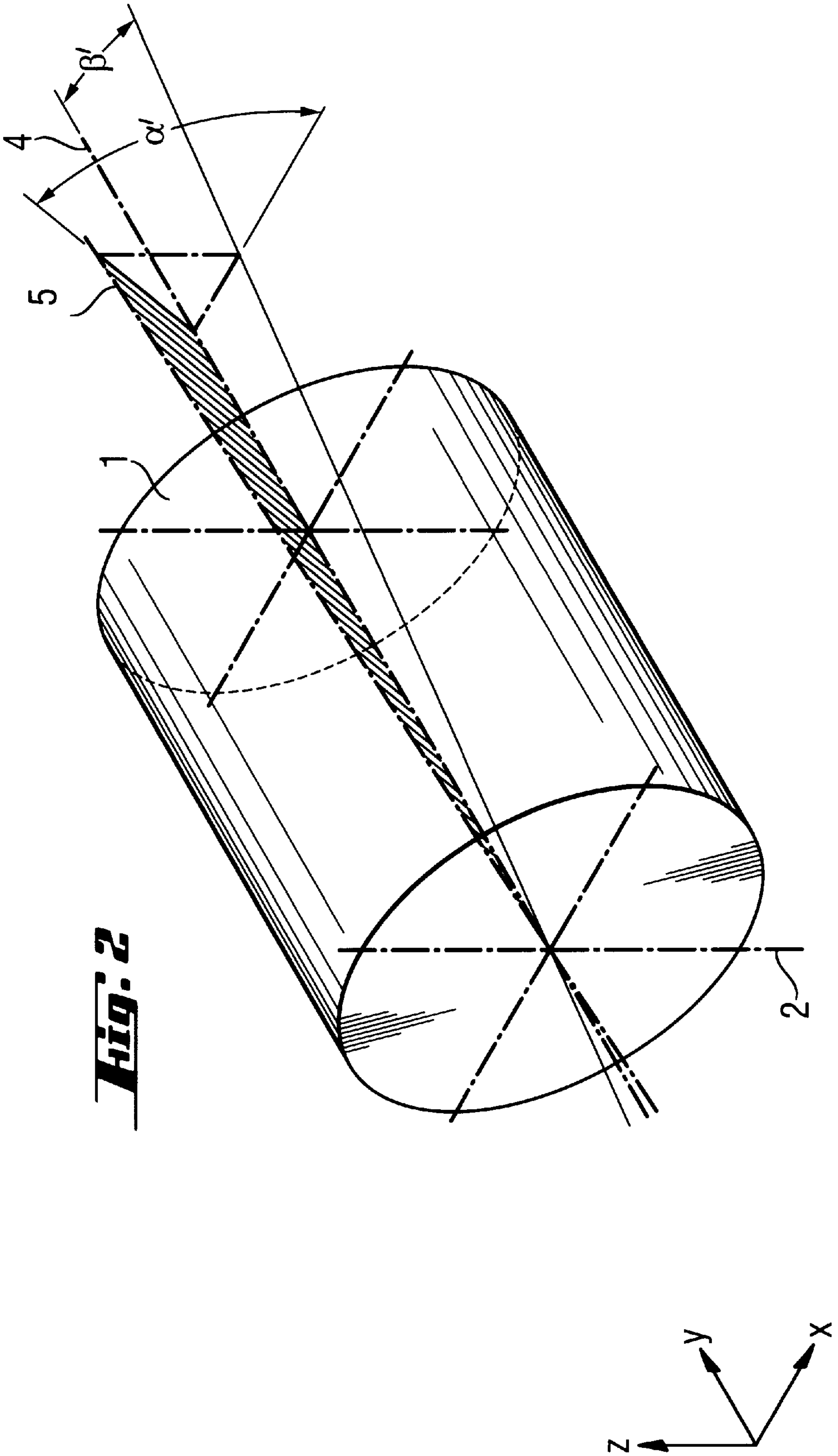
FIG. 2 shows how this objective can be accomplished according to another process embodiment of the invention.

In the process embodiment shown in FIG. 2, the single crystal 1 is rotated first about the longitudinal or geometrical axis 4, until the crystal axis 5 is parallel to the x,y plane. The single crystal is arranged in such a way that the geometrical axis is perpendicular to the y,z plane of the coordinate system. According to the illustration shown in FIG. 2, the single crystal needs to be rotated through an angle α'. Next, the single crystal 1 is rotated through an angle β'. The axis of rotation chosen is an axis 2 which is perpendicular to the x,y plane of the coordinate system. After the single crystal has been rotated, the crystal axis 5 is aligned parallel to the x,y plane and parallel to the x,z plane.

Figure 3:
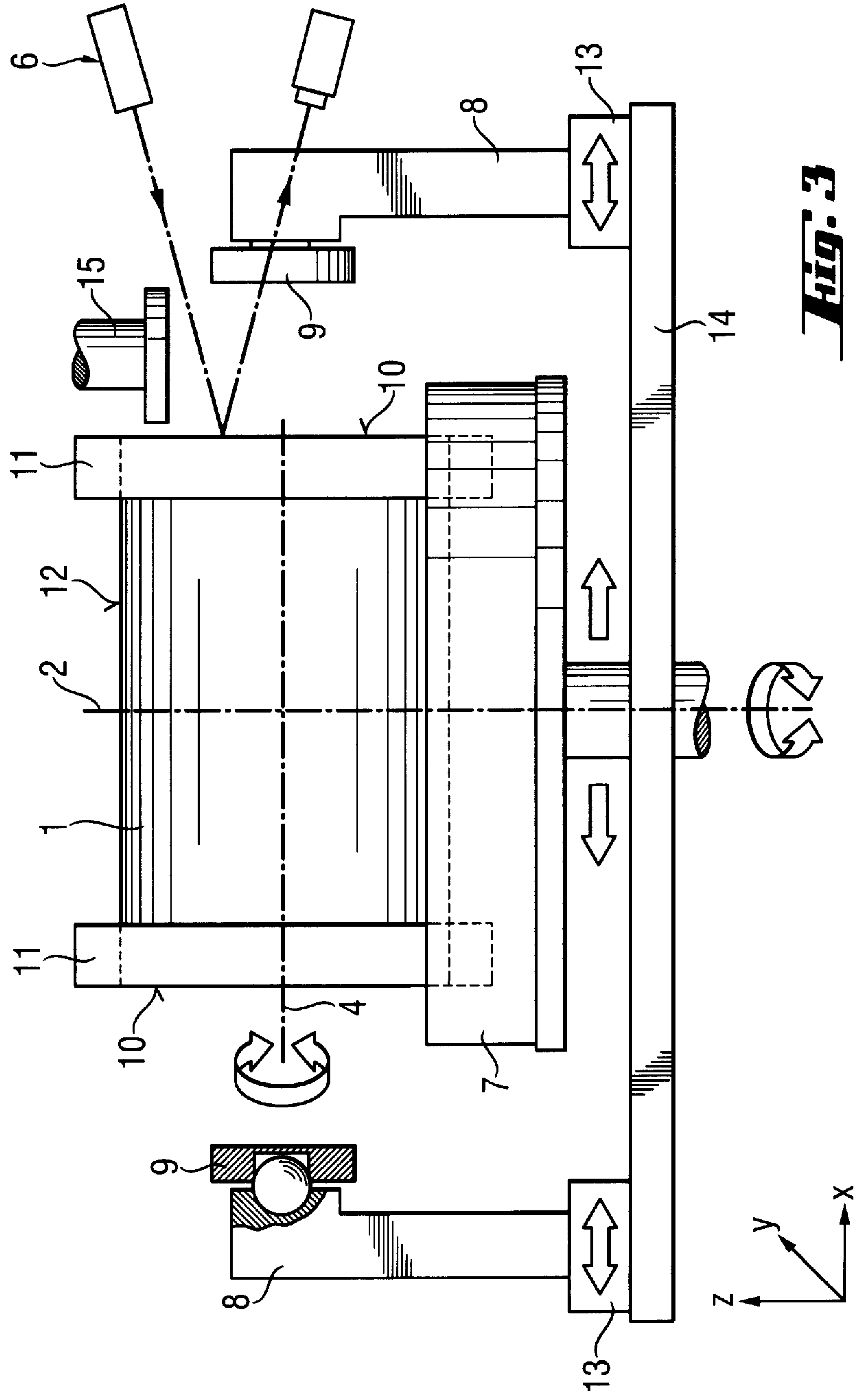
FIG. 3 shows a preferred device for carrying out the process according to the invention.

FIG. 3 shows a device which can be used to rotate a single crystal in the manner described with reference to FIG. 2. The device comprises an X-ray goniometer 6, a rotating device 7 and means 8 for fitting pads 9 to the ends 10 of the single crystal 1. The single crystal is mounted with the aid of centering rings 11 on the rotating device in such a way that it can be rotated about the longitudinal or geometrical axis 4 and the axis of rotation 2. It is particularly preferable to use centering rings 11 whose inner radius can be reduced like the inner radius of an iris diaphragm. The geometrical axis 4 is perpendicular to the y,z plane of the coordinate system, and the axis of rotation 2 is perpendicular to its x,y plane. The rotating device is arranged on a table 14 and can be displaced in a straight line on it, for example for aligning the X-ray goniometer. To make the alignment easier, a stop roll 15 may be provided. Roll 15 is arranged in such a way that the alignment is optimum as soon as the end 10 of the single crystal touches the stop roll when the rotating device is displaced in a straight line.

It is evident that the device may be readily adapted in such a way that the single crystal can be rotated by the rotating device. Instead of being rotated about the geometrical axis 4, it can be rotated about an axis of rotation which is perpendicular to the x,z plane of the coordinate system and preferably intersects the other axis of rotation at L/2. In this case, the process embodiment according to FIG. 1 can be carried out using the device.

When the crystal axis is aligned in the desired way, pads 9 are placed on the ends 10 of the single crystal and fixed on them, preferably adhesively bonded to them. Pads are holders between which the single crystal is clamped when the lateral surface is being ground in a grinding machine. The pads are put on the ends in such a way that the crystal axis passes through their center. Also the crystal axis is the axis of rotation when the lateral surface of the single crystal is being ground. For putting the pads on, the device has a mechanism 13 which displaces the pads in a straight line along the crystal axis until they touch the ends. It has proved advantageous for the pads to be held by a magnetized ball before they are fastened to the ends of the single crystal. The pads can thereby still be positioned accurately even should the ends not be aligned exactly parallel to the y,z plane of the coordinate system.

To complete the process, the lateral surface 12 of the single crystal is ground until the single crystal has a predetermined uniform final diameter.

The invention makes it possible for single crystals which have been produced in the described way to be divided straightforwardly and efficiently into semiconductor wafers. The semiconductor wafers are preferably cut, by means of a wire saw and use the entire width of the wire saw's wire web which is used as a sawing tool. These wafers are cut from a single crystal with sufficient length or from two or more shorter single crystals with a total length corresponding as much as possible to the width of the wire web. The preparations needed for this, in particular with a view to correct alignment of two or more single crystals are extremely straightforward. Thus it is very difficult to make mistakes.

The single crystals, with a total length corresponding as much as possible to the width of the wire web, are placed in tandem next to one another. These crystals are arranged on a flat support, along a straight guide edge, in such a way that the lateral surface of each single crystal bears on the guide edge. The guide edge is used for quick and simple alignment of the single crystals. It can be removed once the single crystals are fixed on the support. The single crystals can, for example, be adhesively bonded to the support and remain aligned along a straight line even after the guide edge has been removed. By precise adjustment of the angle between the sawing of the wire web of the wire saw and this line during the cutting of the semiconductor wafers, it is possible to make semiconductor wafers with precisely defined crystal orientation. If the angle is 90°, the crystal orientation corresponds precisely to the crystal orientation of the cylindrical single crystal. Using an angle different than 90°, alignment errors can be intentionally introduced.

Accordingly, while a few embodiments of the present invention have been shown and described, it is to be understood that many changes and modifications may be made thereunto without departing from the spirit and scope of the invention as defined in the appended claims.

What is claimed is:

1. A process for producing a cylindrical single crystal of semiconductor material, which has a crystal lattice, a crystal axis and a geometrical axis, a spatial position of the crystal axis being established by X-ray optics, comprising the steps of:

a) producing a single crystal with an alignment error of the crystal lattice equal to at most 1.5°;

b) arranging the single crystal in such a way that the single crystal is rotatable about two axes of rotation, the axes of rotation being perpendicular to two planes that are spanned by two axes of an orthogonal coordinate system with axes x, y and z;

c) rotating the single crystal about the axes of rotation until the crystal axis is parallel to the x,y plane and parallel to the x,z plane of the coordinate system;

d) fitting pads to ends of the single crystal; and e) rotating the single crystal about the crystal axis, clamping the single crystal between the pads in a grinding machine, and grinding a lateral surface of the single crystal until the single crystal has a specific uniform diameter.

2. The process as claimed in claim 1, comprising choosing one axis which is perpendicular to the x,y plane of the coordinate system as an axis of rotation; and choosing another axis which is perpendicular to the x,z plane of the coordinate system as an axis of rotation.

3. The process as claimed in claim 1, comprising choosing the geometrical axis of the single crystal as an axis of rotation; and choosing one axis which is perpendicular to the x,y plane of the coordinate system as an axis of rotation.

4. The process as claimed in claim 1, comprising arranging the single crystal in such a way that the axes of rotation intersect at a middle L/2 of the single crystal, L being the length of the single crystal.

5. The process as claimed in claim 1, comprising detaching a seed crystal, whose crystal lattice has an alignment error of at most 1.50 from a parent crystal; and growing the single crystal on the seed crystal.

6. A process for producing semiconductor wafers by means of wire sawing, comprising wire sawing two or more cylindrical single crystals at the same time by a wire guide of a wire saw;

said single crystals having been produced using a process as claimed in claim 1;

having said single crystals be of the same diameter and have the same crystal orientation; and each single crystal having a lateral surface; and during the wire sawing arranging said single crystals next to one another in such a way that the single crystals bear via each's lateral surface on a straight guide edge.

7. A device for producing a cylindrical single crystal of semiconductor material with a smallest possible alignment error of a crystal lattice, comprising a) an X-ray goniometer for establishing a spatial position of a crystal axis of the single crystal;

b) a rotating device having means on which the single crystal is mounted and having means for rotating the single crystal about two axes of rotation, the axes of rotation being perpendicular to two planes that are spanned by two axes of an orthogonal coordinate system with axes x, y and z; and c) means for fitting pads to ends of the single crystal.

8. The device as claimed in claim 7, comprising a table on which the rotating device is mounted so that it can move in a straight line.

9. The device as claimed in claim 7, comprising means for aligning the X-ray goniometer in a desired way.

10. The device as claimed in claim 7, comprising a centering ring which is placed around a lateral surface of the single crystal.

* * * * *